(12) United States Patent
Chiba et al.

(10) Patent No.: US 6,361,662 B1
(45) Date of Patent: *Mar. 26, 2002

(54) METHOD FOR FABRICATING A SEMICONDUCTOR DEVICE IN A MAGNETRON SPUTTERING SYSTEM

(75) Inventors: Yasuhiro Chiba; Keiichi Maeda; Mitsuru Taguchi, all of Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/996,321

(22) Filed: Dec. 22, 1997

(30) Foreign Application Priority Data

Dec. 27, 1996 (JP) .............................................. 8-349211

(51) Int. Cl.$^7$ ........................ C23C 14/34; C23C 14/35; H01L 21/31; H01L 21/469
(52) U.S. Cl. ............................. 204/192.2; 204/298.16; 204/298.17; 204/298.19; 204/298.2; 438/769
(58) Field of Search ........................ 204/192.12, 298.16, 204/298.17, 298.19, 298.2, 192.2, 298.21; 427/527, 531; 438/765, 769, 682

(56) References Cited

U.S. PATENT DOCUMENTS

| | | | | |
|---|---|---|---|---|
| 4,498,969 A | * | 2/1985 | Ramachandran | 204/192.12 |
| 4,554,045 A | * | 11/1985 | Bean et al. | 117/105 |
| 4,663,191 A | * | 5/1987 | Choi et al. | 438/682 |
| 4,995,958 A | * | 2/1991 | Anderson et al. | 204/298.2 |
| 5,194,131 A | * | 3/1993 | Anderson | 204/192.12 |
| 5,217,923 A | * | 6/1993 | Suguro | 437/200 |
| 5,490,913 A | * | 2/1996 | Schertler et al. | 204/298.2 |
| 5,572,916 A | * | 11/1996 | Takano | 83/74 |
| 5,843,356 A | * | 11/1998 | Bothra et al. | 438/384 |

OTHER PUBLICATIONS

CRC Handbook of Chemistry and Physics, 49th edition, The Chemical Rubber Co., p. D–103, 1968–1969.*

* cited by examiner

*Primary Examiner*—Stephen Kalafut
*Assistant Examiner*—Julian A. Mercado
(74) *Attorney, Agent, or Firm*—Sonnenschein, Nath & Rosenthal

(57) ABSTRACT

Disclosed is a magnetron sputtering system enabling formation of a film of a ferroelectric substance by suppressing occurrence of a magnetic field due to an eddy current. The magnetron sputtering system includes a flat target; magnetic field applying means (magnets), provided in the vicinity of a back surface of the target, for applying a magnetic field to a front surface of the target; and magnetic field rotating means (motor) for rotating the magnetic field applying means so as to rotate the magnetic field applied to the front surface of the target. The magnetic field rotating means is provided with rotational speed varying means (speed controller) for varying the rotational speed of the magnetic field applied by the magnetic field rotating means.

2 Claims, 4 Drawing Sheets

METHOD FOR FABRICATING A SEMICONDUCTOR DEVICE IN A MAGNETRON SPUTTERING SYSTEM

BACKGROUND OF THE INVENTION

The present invention relates to a magnetron sputtering system suitable for fabrication of a semiconductor device, and a method of fabricating a semiconductor device using the system.

Recently, there is a requirement to lower resistance and increase operational speed of semiconductor devices. To meet such a requirement, a self-aligned silicide (SALICIDE) process for forming a low resistance silicide film on a gate and source/drain regions in self-alignment is being examined and practically used. In this technique, since Ti and TiN have been already used in the existing process, it is expected to use $TiSi_2$ as a silicide material in terms of self-alignment.

The use of $TiSi_2$ however, has a problem on a so-called fine-line dependent effect. That is, in the case where $TiSi_2$ is formed on a fine interconnection, a sheet resistance gradually increases with a reduction in the line width of the interconnection. The fine-line dependent effect becomes significant for an interconnection having a line width of 1 μm or less, and therefore, it will bring a large problem for the future devices with finer-line geometries.

On the other hand, a silicide such as $CoSi_2$ or NiSi does not exhibit such a fine-line dependent effect, and therefore, it is being actively examined as a silicide material used for the salicide process.

However, since Co or Ni has been little used as a material for a semiconductor process, it is inconvenient in terms of matching with the existing process, and further, since such a material is a ferroelectric substance, a film of the material is difficult to be formed by, for example, a magnetron sputtering system generally used for film formation of Ti, Al or the like in the semiconductor process.

To generate a high density plasma for increasing a film formation rate, a related art magnetron sputtering system has a configuration shown in FIG. 5, in which magnets 2 are disposed on a back surface of a target 1 for allowing a magnetic flux generated by the magnets 2 to be in parallel to a front surface of the target 1 as accurately as possible. When a voltage is applied in such a state, electrons exhibit a cycloidal motion as shown in FIG. 6. Consequently, as compared with a two-pole type DC sputtering system with no magnet, the frequency of collision of the electrons with a discharge gas in the vicinity of the front surface of the target 1 is significantly increased, to thereby generate a high density plasma. In FIG. 5, reference numeral 3 indicates a wafer to be processed; 4 is a wafer holder; 5 is a shield; 6 is a target stage for fixing the target 1 and fixedly containing the magnets 2; 7 is a motor for rotating the magnets 2; and 8 is an AC power supply for operating the motor 7.

For the target 1 made from a ferroelectric substance as described above, however, as shown in FIG. 7, part of an external magnetic field $A_2$ is canceled by a magnetic field $A_1$ due to spontaneous magnetization, so that a surface magnetic field of the target 1 becomes weak. As a result, when compared with sputtering using a paramagnetic substance, the generated plasma becomes weaker, failing to achieve sufficient film formation.

On the other hand, there is known a magnetron sputtering system of a type in which the magnets 2 are rotated for improving uniformity of the film formed by the system. In such a system, however, there occur eddy currents on the surface of the target 1 due to rotation of the magnets 2 as shown in FIG. 8. The occurrence of such eddy currents create a magnetic field to weaken the surface magnetic field of the target 1. Accordingly, for the target 1 made from a ferroelectric substance, the plasma becomes weaker, failing to achieve sufficient film formation.

Such a phenomenon causes even for the target 1 made from Ti, Al, or the like different from the ferroelectric substance; however, in this case, since the surface magnetic field is not weakened as described above, it does not obstruct film formation. On the contrary, for the target made from a ferroelectric substance, the surface magnetic field is weakened as shown in FIG. 7, and thereby generation of plasma is also weakened. Consequently, generation of a magnetic field due to eddy currents largely obstructs film formation of a ferroelectric substance.

SUMMARY OF THE INVENTION

An object of the present invention is to provide a magnetron sputtering system enabling film formation of a ferroelectric substance by suppressing occurrence of a magnetic field due to eddy currents.

Another object of the present invention is to provide a method of fabricating a semiconductor device, enabling film formation of a silicide of a ferroelectric substance using the above magnetron sputtering system.

To achieve the first object, according to the present invention, there is provided a magnetron sputtering system including: a flat target; magnetic field applying means, provided in the vicinity of a back surface of the target, for applying a magnetic field to a front surface of the target; and magnetic field rotating means for rotating the magnetic field applying means so as to rotate the magnetic field applied to the front surface of the target; wherein the magnetic field rotating means is provided with rotational speed varying means for varying a rotational speed of the magnetic field applied by the magnetic field rotating means.

In this magnetron sputtering system, the rotational speed of a magnetic field applied by the magnetic field rotating means can be suitably set by the rotational speed varying means in such a manner as not to cause a large eddy current on the surface of the target. As a result, even in the case of using the target made from a ferroelectric substance, it is possible to suppress the magnetic field from being weakened due to occurrence of the eddy current, and hence to stably generate a high density plasma.

The magnetron sputtering system is thus allowed to uniformly form a film of a ferroelectric substance such as Co or Ni, and hence to easily realize film formation of a ferroelectric material by the magnetron sputtering system which has been not adopted by the related art fabrication process for a semiconductor device.

Further, in this magnetron sputtering system, the rotational speed of the magnetic field can be suitably set depending on the kind of the target material; consequently, for example, films of a paramagnetic substance and a ferroelectric substance are easily formed in sequence using the same cathode only by exchanging the targets made from these substances from each other and setting the rotational speed depending on the kind of the exchanged target material.

To achieve the second object, according to the present invention, there is provided a method of fabricating a semiconductor device, including the steps of: forming a film of a ferroelectric substance on a polysilicon gate formed on a silicon substrate and on source and drain regions formed on a surface layer portion of the silicon substrate by sputtering using the above magnetron sputtering system; and forming a silicide layer on surface layer portions of the polysilicon gate, source region and drain region by annealing the substrate.

According to this method of fabricating a semiconductor device, a film of a ferroelectric substance such as Co or Ni is formed on a polysilicon gate and on source and drain regions formed on a surface layer portion of a silicon substrate. As a result, it is possible to uniformly form the ferroelectric film to a sufficient thickness, and hence to form a uniform silicide layer by the subsequent annealing. The fabrication method is thus allowed to form a uniform silicide layer having a low resistance without the fine-line dependent effect, and hence to fabricate a high speed semiconductor device with a high reliability.

DETAILED DESCRIPTION OF THE PREFERRED EMBODIMENTS

Hereinafter, preferred embodiments of the present invention will be described in detail with reference to the accompanying drawings.

Figure 1:
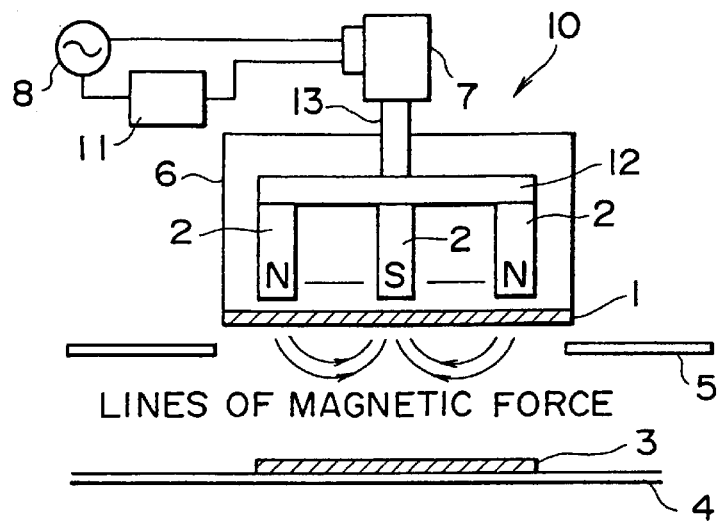
FIG. 1 is a schematic view of a configuration of a first embodiment of a magnetron sputtering system of the present invention.
Figure 5:
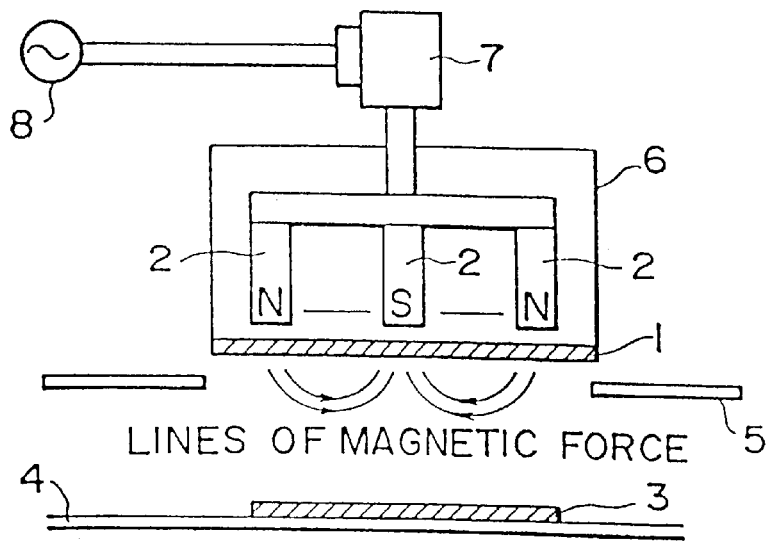
FIG. 5 is a schematic view of a configuration of one example of a related art magnetron sputtering system.
Figure 6:
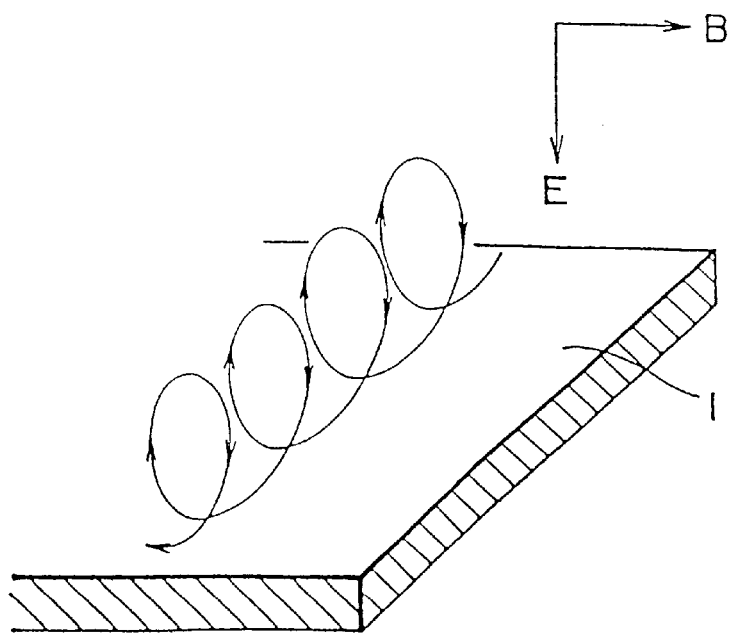
FIG. 6 is a perspective view illustrating the function of the related art magnetron sputtering system.
Figure 7:
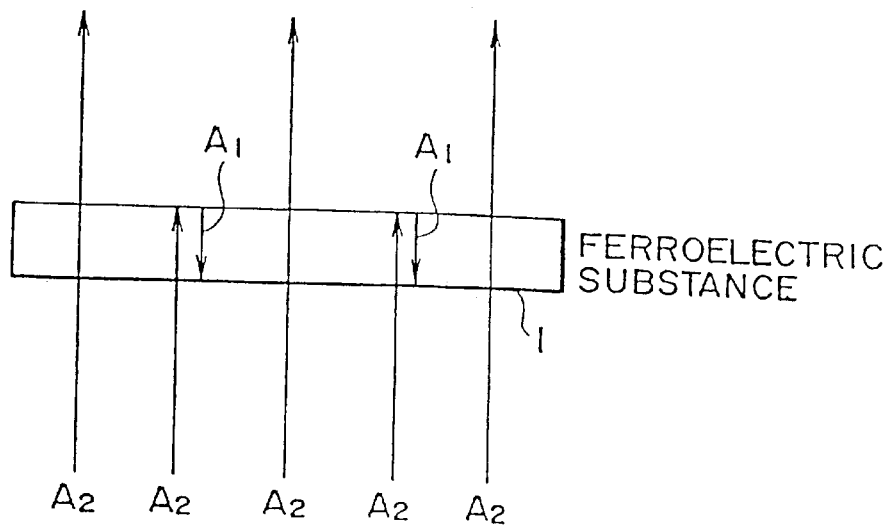
FIG. 7 is a typical view illustrating a problem of the related art magnetron sputtering system.
Figure 8:
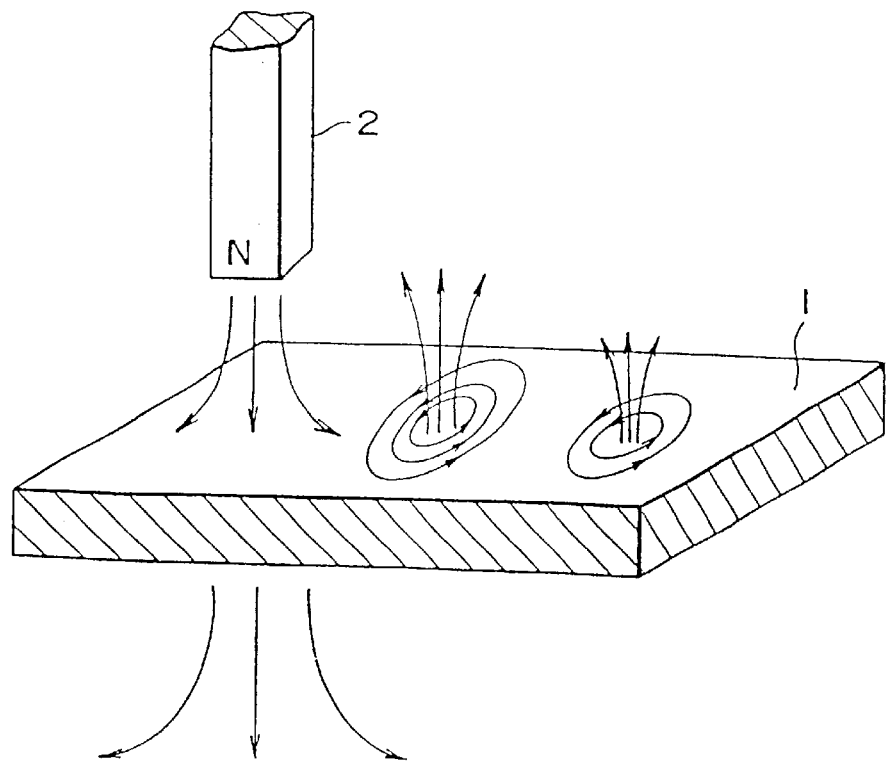
FIG. 8 is a perspective view illustrating another problem of the related art magnetron sputtering system.

FIG. 1 is a schematic view showing a first embodiment of a magnetron sputtering system of the present invention. In this figure, reference numeral 10 generally indicates a magnetron sputtering system. The magnetron sputtering system 10 is different from the magnetron sputtering system shown in FIG. 5 in that it is provided with a speed controller 11 for varying a rotational speed of a motor 7.

The magnetron sputtering system 10 includes a flat target 1; magnets (magnetic field applying means) 2 provided in the vicinity of a back surface of the target 1; a motor (magnetic field rotating means) 7 connected to the magnets 2 through a mounting plate 12 and a shaft 13; and the speed controller 11 for varying the number of rotations of the motor 7, that is, controlling the number of rotations (rotational speed) of the motor 7. In this system, a high density plasma can be generated by applying a magnetic field on the front surface of the target 1 by the magnets 2, and uniformity of a film formed by sputtering can be achieved by rotating the magnets 2, that is, the magnetic field applied from the magnets 2.

Figure 2:
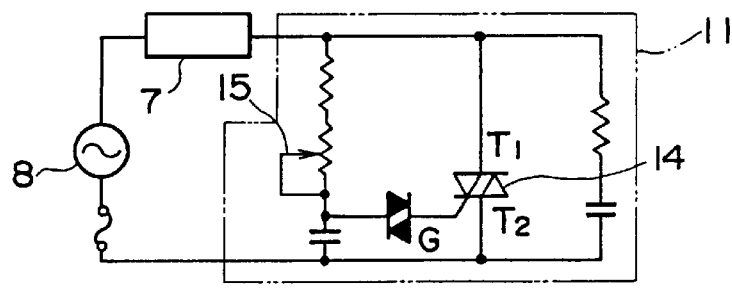
FIG. 2 is a circuit diagram used for a speed controller.

The speed controller 11, which constitutes the rotational speed varying means of the present invention, is provided between an AC power supply 8 and the motor 7. The speed controller 11 is composed of, for example, a circuit using a semiconductor element 14 called a triac shown in FIG. 2. The circuit is adapted to control the number of rotations (rotational speed) of the motor 7 by adjusting a timing at which a voltage is applied to the motor 7. The semiconductor element 14 in this circuit has the following configuration:

The semiconductor element 14 keeps cut-off of the current until the current is applied to a gate G, and once the current is applied to the gate G, the circuit is closed. The state is kept until the voltage becomes zero and the current also becomes zero after termination of the half-cycle of the alternating current. However, as the voltage is shifted from a positive value to a negative value, the triac (semiconductor element 14) cuts off the circuit again, and it does not allow the current to flow between terminals $T_1$ and $T_2$ until the current is applied to the gate G again.

The circuit using the semiconductor element 14, accordingly, adjusts an effective voltage applied to the motor at a value lower than the source voltage by adjusting, using the resistance 15, a period of time elapsing from a time point at which the voltage passes through zero to a time point at which the current is applied to the gate G. Thus, the circuit controls the speed of the motor 7 (single-phase AC motor in this example).

In film formation using the magnetron sputtering system 10 having the above configuration, the dependency of the number of rotations (rotational speed) of a magnetic field on various factors depending on the kind of the target 1 used is predetermined by experiments or the like, and the number of rotations of the magnetic field matching with the required film quality is set and thus the number of rotations of the motor 7, that is, the number of rotations of the magnetic field due to the magnets 2 is controlled by the speed controller 11. Here, the factors depending on the kind of the target 1 include stability of plasma, film formation rate, uniformity of the film obtained, and the like. Accordingly, the number of rotations of the motor 7 is set for controlling these factors so as to obtain the required film quality.

In the magnetron sputtering system 10, the magnetic field can be rotated at the most suitable number of rotations depending on the kind of the target 1 on the basis of the dependency of the number of rotations of the magnetic field predetermined by experiments or the like. For example, in the case where film formation is performed using the target made from a ferroelectric substance such as Co or Ni, the number of rotations of the magnetic field can be set, by the speed controller 11, at the most suitable value not to generate large eddy currents on the surface of the target. Thus, it is possible to suppress the magnetic field from being weakened due to occurrence of eddy currents and hence to stably generate a high density plasma and achieve uniform film formation.

With respect to the dependency of the number of rotations of the magnetic field on the above factors, it is desired to make smaller the number of rotations of the motor 7 for the stability of plasma and film formation rate, and also it is desired to make larger it for the uniformity of the film.

Although the motor 7 shown in FIG. 1 is of the AC type, it may be of a DC type.

Figure 3:
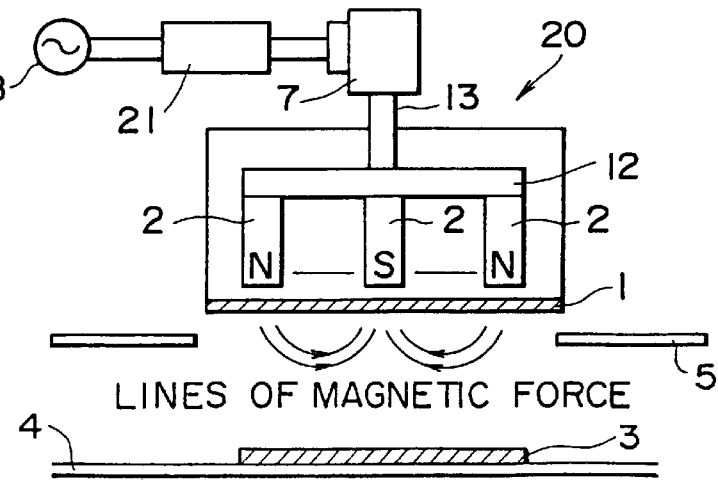
FIG. 3 is a schematic view of a configuration of a second embodiment of the magnetron sputtering system of the present invention.

FIG. 3 is a schematic view showing a second embodiment of the magnetron sputtering system of the present invention. In FIG. 3, reference numeral 20 generally indicates a magnetron sputtering system which is different from the magnetron sputtering system 10 in that the speed controller 11 as the rotational speed varying means for varying the rotational speed of the motor (magnetic field rotating means) 7 is replaced with an invertor 21.

Like the speed controller 11, the invertor 21 is disposed between the AC power supply 8 and the motor 7, and it varies the number of rotations (rotational speed) of the motor 7 by changing the frequency of a current supplied from the AC power supply 8, to thereby control the number of rotations (rotational speed) of the magnetic field applied by the magnets 2.

Accordingly, even for the magnetron sputtering system 20, the magnetic field can be rotated at the most suitable number of rotations depending on the kind of the target 1 on the basis of the dependency of the number of rotations of the magnetic field predetermined by experiments or the like, to stably generate a high density plasma, thereby achieving uniform film formation.

In particular, the use of the invertor 21 allows the power to be efficiently converted, and consequently, as compared with the magnetron sputtering system 10 using the speed controller 11, it is possible to eliminate a reduction in torque due to lowering of the rotational speed.

Next, one embodiment of a method of fabricating a semiconductor device will be described.

FIGS. 4A to 4D are views illustrating one embodiment of the method of fabricating a semiconductor device according to the present invention, wherein the salicide process is performed using the magnetron sputtering system 10 or 20 shown in FIG. 1 or 3. In this embodiment, a low resistance silicide film, which is made from $CoSi_2$ (cobalt silicide) not exhibiting the fine-line dependent effect, is formed on a gate and source and drain regions.

Figure 4A:
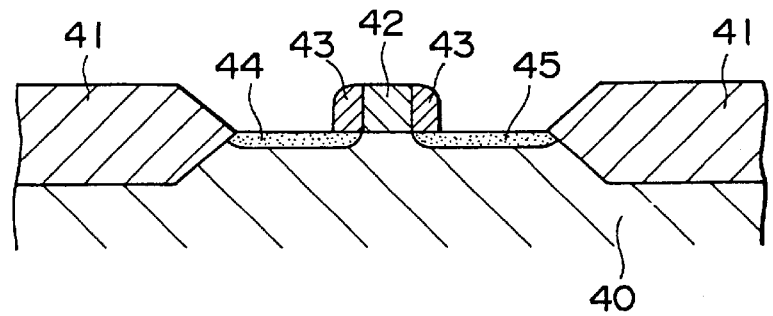
FIGS. 4A to 4D are sectional views of an essential portion of a semiconductor device illustrating one embodiment of a method of fabricating a semiconductor device according to the present invention in the order of fabrication steps.

Referring first to FIG. 4A, LOCOS regions 41 are formed on a surface layer portion of a silicon substrate 40 by a known process, and a gate electrode 42 made from polysilicon and side walls 43 are formed on the silicon substrate 40. Then, ions of an impurity are doped and diffused in the surface layer portion of the silicon substrate 40 by ion-implantation and the like, to form a source region 44 and a drain region 45.

Figure 4B:
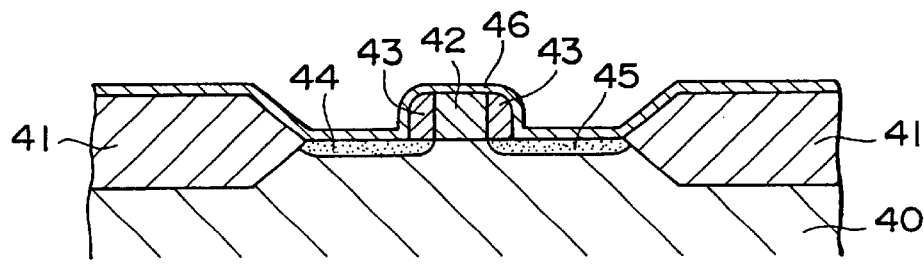

A Co film 46 is formed on the silicon substrate 40 by sputtering to a thickness of about 10 nm in such a manner as to cover the gate electrode 42, source region 44, and drain region 45 as shown in FIG. 4B. The sputtering is performed by the magnetron sputtering system 10 or 20 using a Co plate as the target 1 in the following condition:

Formation Condition of Co Film
  DC power: 0.8 kW
  pressure: 0.4 Pa
  flow rate of gas: heater gas (Ar) 30 sccm process gas (Ar) 60 sccm
  substrate heating temperature: 150° C.

With respect to the number of rotations of the motor 7, that is, the number of rotations of the magnetic field by the magnets 7 upon film formation of the Co film 46, the stability of plasma, film formation rate, and uniformity of the film are previously evaluated by changing the number of rotations of the magnets 2, and the most suitable value is selected. In addition, the heater gas is supplied to heat the substrate and is kept at temperature of 150° C.

Figure 4C:
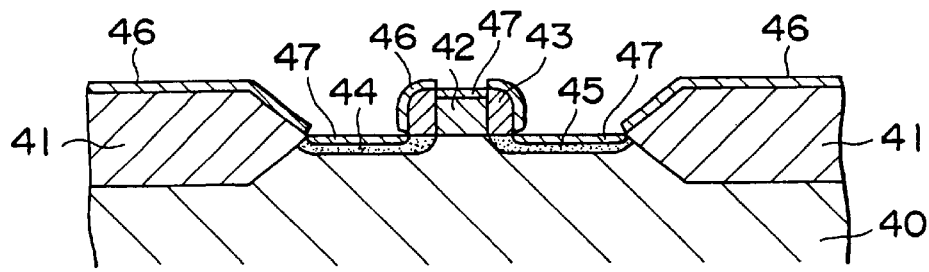

The silicon substrate 40 is then put in a RTA system, and is subjected to a first heat-treatment (annealing) in a nitrogen atmosphere at a temperature of 450 to 550° C. for 30 seconds. In this heat-treatment, the Co film 46 reacts with the polysilicon forming the gate electrode 42 and the silicon forming the source region 44 and the drain region 45, to form a cobalt silicide layer 47 as shown in FIG. 4C. It should be noted that the cobalt silicide layer 47 formed by the first heat-treatment has a CoSi phase because the heat-treatment temperature is low (450 to 550° C.).

Figure 4D:
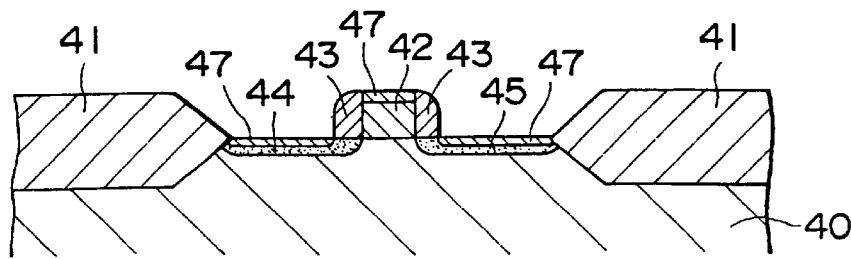

As shown in FIG. 4D, the unreacted Co film 46 on the LOCOS regions 41 and the side walls 43 is removed by wet-etching for 3 minutes using a mixture of sulfuric acid and hydrogen peroxide ($H_2SO_4:H_2O_2=4:1$) kept at 70° C. as a processing chemical.

Then, the silicon substrate 40 is subjected to a second heat-treatment (annealing) in a nitrogen atmosphere at a temperature of 650 to 800° C. for 30 seconds. In this heat-treatment, the cobalt silicide layer 47 is phase-converted from the CoSi phase into a $CoSi_2$ phase. The $CoSi_2$ phase exhibits the lowest resistance among the phases of the Co silicide.

In this process, since film formation is performed using the magnetron sputtering system 10 or 20 in a condition in which the number of rotations of the motor 7, that is, the number of rotations of the magnetic field by the magnets 2 is most suitably controlled, it is possible to uniformly form a film of cobalt as a ferroelectric substance on the silicon substrate 40 to a sufficient thickness, and hence to form the uniform cobalt silicide layer 47 made from $CoSi_2$ exhibiting a low resistance without the fine-line dependent effect by the subsequent annealing.

Although the silicide layer is represented by the cobalt silicide layer 47 in this embodiment, the present invention is not limited thereto. For example, a nickel silicide (NiSi) layer can be similarly formed as the silicide layer. In this case, a Ni plate is used as the target 1 in the magnetron sputtering system 10 or 20, and a Ni film is formed in the same condition as that for formation of the Co film. However, the thickness of the Ni film may be set at about 20 nm. Further, since the Ni silicide is not required to be phase-converted differently from the Co silicide, only one heat-treatment by RTA (annealing) for forming NiSi may be performed, for example, in a nitrogen atmosphere at a temperature of 400 to 600° C. for 30 seconds.

While the preferred embodiment of the present invention has been described using specific terms, such description is for illustrative purposes only, and it is to be understood that changes and variations may be made without departing from the spirit or scope of the following claims.

What is claimed is:

1. A method of fabricating a semiconductor device comprising the steps of:

providing a silicon substrate having a polysilicon gate on a surface of the substrate with source and drain regions in the surface of the substrate;

providing a magnetron sputtering system having a flat target of a ferromagnetic material consisting of cobalt, magnetic field applying means in the vicinity of a back surface of the target to apply magnetic field to a front surface of the target, magnetic field rotating means to rotate said magnetic field applying means so that the magnetic field on the front surface of the target is rotated, and means to suppress eddy currents on the front surface of the target by varying the rotational speed of the magnetic field rotating means;

positioning the substrate in the sputtering system;

forming a film of cobalt on the polysilicon gate and the source and drain regions by sputtering while rotating the magnetic field at a rotational speed selected for cobalt;

forming a cobalt silicide layer out of the cobalt film on surface layer portions of said polysilicon gate, source region and drain region by annealing said substrate, said annealing being in two steps separated by a wet etching step with the first annealing step being at a temperature range of 450° to 550° C. for 30 seconds and the second annealing step being at a range of 650° to 800° C. for 30 seconds.

2. A method of fabricating a semiconductor device comprising the steps of:

providing a magnetron sputtering system having a flat target of a ferromagnetic material consisting of nickel, magnetic field applying means in the vicinity of a back surface of the target to apply a magnetic field to a front surface of the target, magnetic field rotating means to rotate said magnetic field applying means so that the magnetic field on the front surface of the target is rotated, and means to suppress eddy currents on the front surface of the target by varying the rotational speed of the magnetic field rotating means;

providing a silicon substrate having a polysilicon gate on a surface of the substrate with source and drain regions in the surface of the substrate;

positioning the substrate in the sputtering system;

forming a film of nickel on the polysilicon gate and the source and drain regions by sputtering while rotating the magnetic field at a rotational rate for nickel;

forming a nickel silicide layer of the nickel film on surface layer portions of said polysilicon gate, source region and drain region by annealing said substrate in a single step at a temperature range of 400° to 600° C. for 30 seconds.

* * * * *